United States Patent [19]

Tamburro

[11] 4,076,356
[45] Feb. 28, 1978

[54] INTERCONNECTION PIN FOR MULTILAYER PRINTED CIRCUIT BOARDS

[75] Inventor: Peter James Tamburro, Hanover Township, Morris County, N.J.

[73] Assignee: Bell Telephone Laboratories, Incorporated, Murray Hill, N.J.

[21] Appl. No.: 733,333

[22] Filed: Oct. 18, 1976

[51] Int. Cl.² .......................... H05K 1/12; H05K 1/14
[52] U.S. Cl. ................ 339/17 C; 339/17 M; 339/221 R
[58] Field of Search ............ 339/17 R, 17 LM, 17 E, 339/17 C, 17 M, 95 R, 220 R, 221 R, 221 M, 252 P

[56] References Cited

U.S. PATENT DOCUMENTS

| 2,820,209 | 1/1958 | Whitted | 339/221 R |
|---|---|---|---|
| 2,892,178 | 6/1959 | Harris | 339/221 R |
| 2,914,745 | 11/1959 | Krol et al. | 339/220 R |
| 3,202,755 | 8/1965 | Oswald | 339/220 R |
| 3,783,433 | 1/1974 | Kurtz et al. | 339/17 C |
| 3,964,813 | 6/1976 | Pizzeck | 339/17 M |
| 3,975,078 | 8/1976 | Ammon | 339/221 M |
| 4,017,143 | 4/1977 | Knowles | 339/221 R |

FOREIGN PATENT DOCUMENTS

| 1,125,123 | 7/1956 | France | 339/17 E |

Primary Examiner—Roy Lake
Assistant Examiner—Neil Abrams
Attorney, Agent, or Firm—John W. Fisher

[57] ABSTRACT

A connector is disclosed for interconnecting multiple conductive layers in a printed circuit board. The connector includes a pair of elongated electrical terminals and a compliant section in between. A plurality of generally parallel raised pressure ridges are included on an outer surface of the compliant section. The connector may be advantageously divided into a plurality of semiseparate segments thereby enabling interconnection of an axially aligned stack of printed circuit boards.

17 Claims, 11 Drawing Figures

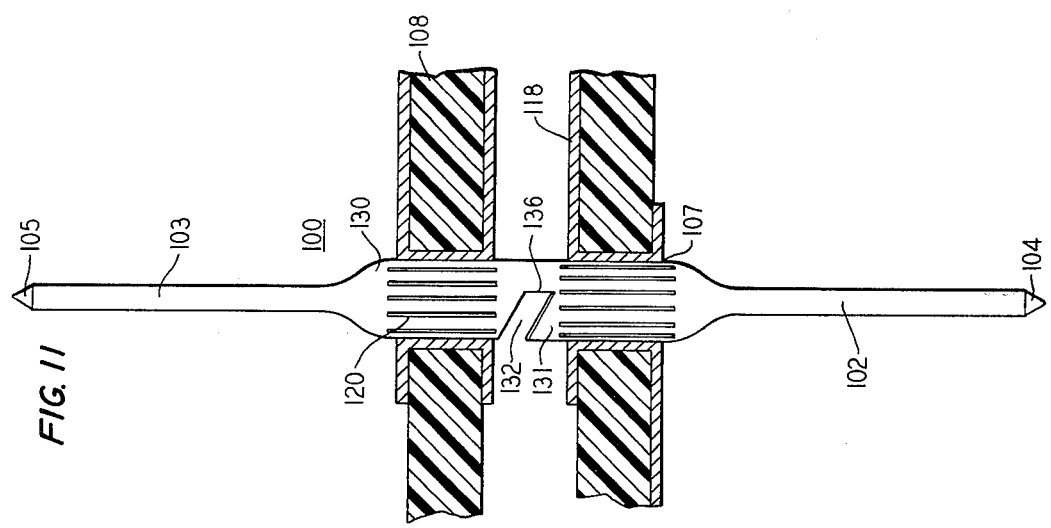
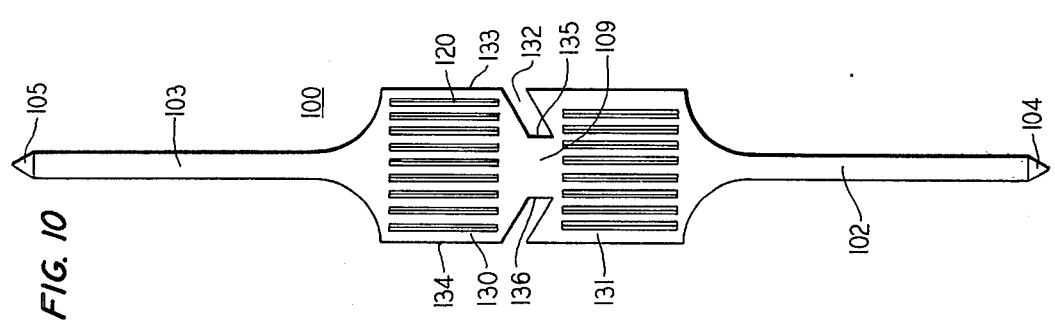
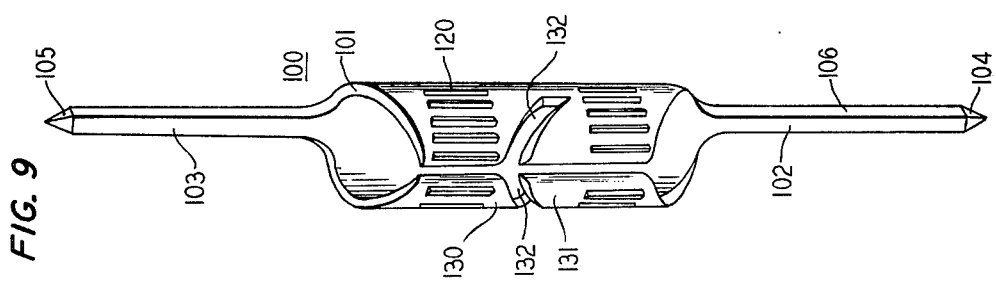

INTERCONNECTION PIN FOR MULTILAYER PRINTED CIRCUIT BOARDS

BACKGROUND OF THE INVENTION

1. Field of the Invention

This invention relates to electrical connectors and, in particular, to a connector for electrically interconnecting multiple conductive layers in a printed circuit board and a method for making such a connector.

2. Description of the Prior Art

Current objectives in circuit design include a decrease in overall physical size with a concurrent increase in component density on a printed circuit board. To meet these objectives more and more circuit designers are utilizing multilayer printed circuit boards.

One of the problems encountered in the use of multilayered boards is the electrical interconnection of the various conductive layers within the board at appropriate points. Another problem is the interconnection of discrete components or connectors to the circuit board. A third problem relates to the effectiveness of the interconnection device in maintaining a reliable, gastight connection during the life of the circuit.

Connectors which alleviate to some extent the first two problems have been disclosed in U.S. Pat. No. 3,400,358 issued to H. P. Byrnes et al on Sept. 3, 1968; U.S. Pat. No. 3,783,433 issued to H. N. Kurtz et al on Jan. 1, 1974; and U.S. Pat. No. 3,907,400 issued to R. K. Dennis on Sept. 23, 1975. However, none of these connectors adequately solves the third problem. In particular, insertion of any of these types of connectors into a plated-through hole in the multilayer board, especially where the plating is covered by oxides or other contaminants, does not ensure a reliable connection.

In some circuit applications it may be desirable to axially stack a number of multilayer boards atop one another to further increase the packaging density. Fabrication of a single multilayer board with an equivalent number of layers is often provided by cost and reliability considerations. Consequently, stacking is utilized.

While the concept of stacking is known, as evidenced by U.S. Pat. No. 3,893,233 issued to D. W. Glover on July 8, 1975, the reliability problem set out previously is not alleviated.

Accordingly, it is one object of the present invention to configure a connector which advantageously ensures a reliable connection to oxide coated or contaminated conductive platings.

Another object is to diminish the production of conductive slivers during connector insertion.

A further object of the present invention is to provide a connector which produces a nearly uniform radial pressure on conductive material on the periphery of a plated-through hole upon insertion of the connector.

Yet another object is to reduce the possibility of connector rotation during wire-wrapping operations.

Still a further object of the present invention is to facilitate axial stacking of a plurality of printed circuit boards with each board engaging a semiseparate segment of a connector.

SUMMARY OF THE INVENTION

The foregoing and other objects of the invention are realized in an illustrative embodiment of a connector for electrically interconnecting multiple conductive layers in a printed circuit board having at least one aperture with electrically conductive material about its periphery. First and second terminals are included on opposite ends of the connector for receiving electrically conductive elements. Intermediate the first and second terminals is a unitary compliant section for producing a nearly uniform radial pressure on the electrically conductive material on the periphery of the aperture upon insertion of the connector. Integral with the unitary compliant section are raised pressure members for engaging the conductive material about the aperture periphery at a plurality of discrete radial points.

Accordingly, it is one feature of the present invention that the raised pressure members penetrate the conductive material about the aperture periphery to ensure a reliable connection.

Another feature is that the raised pressure members displace portions of the conductive material thereby reducing the production of conductive slivers.

Yet another feature of the present invention is that the unitary compliant section produces a nearly uniform radial pressure on the aperture periphery upon insertion of the connector into the aperture.

A further feature is that engagement between the raised pressure members and the aperture periphery impede connector rotation as electrical connections are made to the first and second receiving terminals.

Still a further feature of the present invention is that the raised pressure members permit the passage of flux and solder between the compliant section and the conductive material on the aperture periphery.

An even further feature is that the compliant section can be advantageously segmented into a plurality of semiseparable sections to permit axial stacking of a plurality of printed circuit boards wherein each section engages an individual board.

BRIEF DESCRIPTION OF THE DRAWINGS

The aforementioned objects and features of the invention, as well as other objects and features, will be better understood upon consideration of the following detailed description and appended claims taken in conjunction with the attached drawings of an illustrative embodiment in which:

FIG. 9 is a perspective view similar to FIG. 1 illustrating the sectioning of the compliant portion to form semiseparate segments;

FIG. 10 is a side view of an unformed connector shown in FIG. 9; and

FIG. 11 illustrates stacking of two circuit boards with the connector illustrated in FIG. 9.

DETAILED DESCRIPTION

Figure 2:
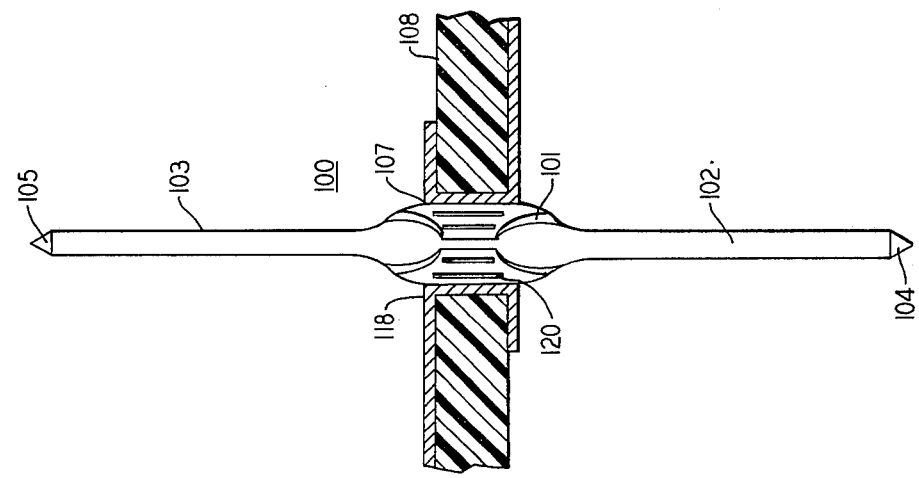
FIG. 2 illustrates the connector in engagement with a circuit board.
Figure 1:
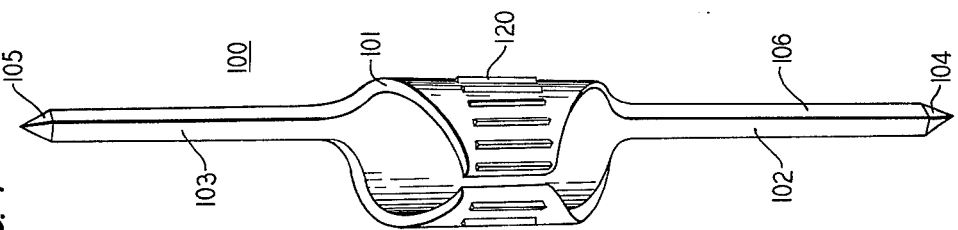
FIG. 1 is a perspective view of a connector having a single compliant central section.

An interconnection pin 100, illustrated in FIG. 1, includes a compliant section 101 and a pair of terminals 102 and 103 integral therewith and extending outwardly in opposite directions. Terminals 102 and 103 are elongated members having a generally rectangular cross section. This cross section advantageously permits electrically conductive elements to be connected to terminals 102 and 103 by techniques such as wire wrapping for example. Generally tetrahedron-shaped tips 104 and 105 at the ends of terminals 102 and 103, respectively, facilitate insertion of pin 100 into an aperture 107 in a circuit board 108, as shown in FIG. 2.

Figure 3:
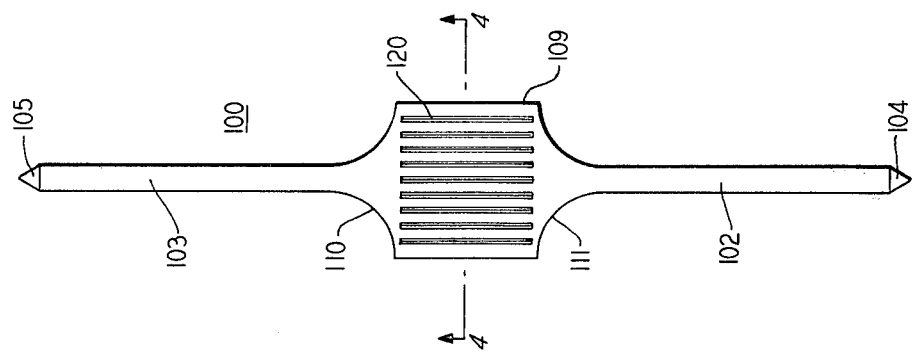
FIG. 3 is a side view of an unformed connector.
Figure 4:
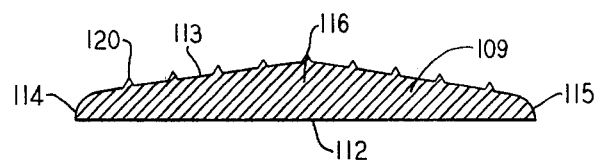
FIG. 4 is a cross-sectional view along section 4—4 of FIG. 3.

Compliant section 101 includes a generally rectangular-shaped central portion 109, as shown in its unformed state in FIG. 3, which is integrally coupled to terminals 102 and 103 by tapered cross sections 110 and 111, respectively. Tapered cross section 110 decreases in width from central portion 109 to terminal 103. Correspondingly, tapered cross section 111 decreases in width from central portion 109 to terminal 102. Central portion 109 has a nonuniform thickness between an inner surface 112 and an outer surface 113 as shown in FIG. 4. This nonuniform thickness varies from a minimum near tips 114 and 115 to a maximum in central region 116.

In its formed state, compliant section 101 has a generally cuplike-shaped cross section, as illustrated in FIGS. 5 through 8, which lies in a plane perpendicular to a plane containing an axis of symmetry of pin 100. The diameter of the cuplike-shaped cross section is slightly larger than the diameter of aperture 107 and is substantially larger than a width dimension of a side face 106 of terminal 102 as shown in FIG. 1. With the thickness and cross sectional dimensions as described, compliant section 101 produces a nearly uniform radial pressure on conductive material 118 about the periphery of aperture 107, as shown in FIG. 2, when pin 100 is brought into engagement with circuit board 108.

Along outer edge 133 of central portion 109 and integral therewith are a plurality of raised pressure ridges 120. Pressure ridges 120 are generally parallel with an axis of symmetry of pin 100, as shown in FIG. 3. Upon insertion of pin 100 into aperture 107, pressure ridges 120 engage conductive material 118 at a plurality of discrete radial points. As this engagement takes place, pressure ridges 120 break up any oxides formed on conductive material 118 and displace portions of this material thereby reducing the production of conductive slivers as pin 100 is further inserted into aperture 107. Pressure ridges 120 further permit passage of flux and solder between compliant section 101 and the periphery of conductive material 118 about the periphery of aperture 107. It should be noted also that pressure ridges 120 impede the rotation of pins 100 as a wire-wrapped connection is made with terminals 102 and 103.

Figure 5:
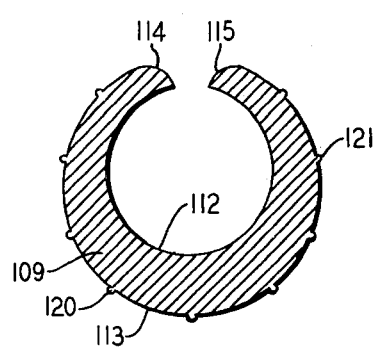
FIG. 5 is a cross-sectional view of the compliant section wherein the pressure ridges are raised semicircular beads.
Figure 6:
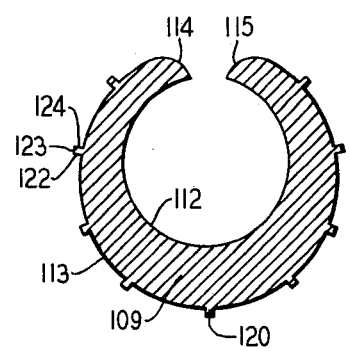
FIG. 6 is similar to FIG. 5 except the pressure ridges have a rectangular cross section.

In one embodiment of pin 100, compliant section 101 has a generally crescent-shaped cross section, as shown in FIG. 5, the thickness of which is smallest near tips 114 and 115 and largest at a midpoint between the two tips. The pressure ridges 120 in this embodiment are comprised of projections having a single, generally semicircular face 121. In another embodiment, shown in FIG. 6, pressure ridges 120 may be advantageously comprised of generally rectangular projections having first, second, and third faces 122, 123 and 124, respectively, first and third faces 122 and 124 being spaced apart and generally parallel with one another, while second face 123 is generally perpendicular to first and third faces 122 and 124.

Figure 7:
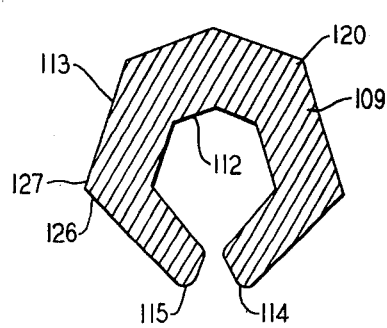
FIG. 7 is similar to FIG. 5 except the cross section has generally piecewise linear inner and outer surfaces.
Figure 8:
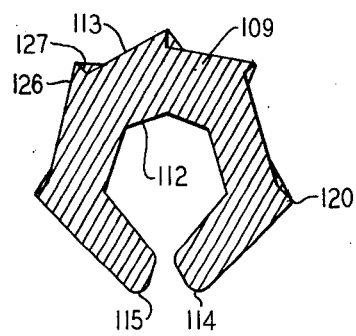
FIG. 8 is similar to FIG. 7 except the pressure ridges have a generally triangular-shaped cross section.

Further embodiments of compliant section 101 are shown in FIGS. 7 and 8. In these embodiments the cuplike-shaped cross section has generally polygonal-shaped inner and outer surfaces 112 and 113. Pressure ridges 120 for these two embodiments are formed by first and second faces 126 and 127 oriented at an angle between 90° and 150° with respect to one another.

In applications where it is desirable to stack circuit boards 108 atop one another, pin 100 has its compliant section 101 segmented into a plurality of semiseparate sections 130 and 131, for example, as shown in FIGS. 9 and 10. Each section engages a separate circuit board 108 in an axially aligned stack of such boards as illustrated in FIG. 11. Segmentation of compliant section 101 into the plurality of semiseparate sections 130 and 131 is effected by one or more pairs of oppositely directed notches 132. Notches 132 extend from edges 133 and 134 of central portion 109 to intermediate points 135 and 136, respectively. Notches 132 are oriented at an angle between 30° and 90° with respect to the axis of symmetry of pin 100.

Pressure ridges 120 on sections 130 and 131, in these embodiments of pin 100 are radially offset from one another. This radial offset of pressure ridges 120 ensures that sections 130 and 131 will engage virgin conductive material 118 in aperture 107 as pin 100 passes through circuit boards 108 in an axial stack of boards. Consequently, all the advantages attributed to pressure ridges 120 resulting from their engagement with conductive material 118 at the periphery of aperture 107 in a single circuit board 108 are equally applicable to any additional boards 108 when a stack of such boards are to be interconnected.

A number of methods for fabricating a connector as described above may be advantageously utilized. One such method includes the steps of stamping a sheet of electrically conductive material to form first and second elongated terminals 102 and 103 with generally rectangular-shaped central portion 109 intermediate terminals 102 and 103. Central portion 109 is then swaged to produce a nonuniform thickness wherein the thickness along outer edges 133 and 134 of the central portion 109 is less than the thickness through central region 116.

Central portion 109 is then coined to produce the plurality of generally parallel pressure ridges 120. It should be noted that pressure ridges 120 produced by this operation are to be generally parallel with an axis of symmetry which passes through terminals 102 and 103 of pin 100. At the end of these three steps pin 100 has a shape as illustrated in either FIG. 3 or FIG. 10, depending upon whether pin 100 is to be used for a single board application or the stacking of two or more boards 108. Central portion 109 is then cupped to impart the generally cuplike-shaped cross section to compliant section 101 when the latter is viewed in a plane generally perpendicular to the axis of symmetry of pin 100. Finally, the distant ends of terminals 102 and 103 are coined to produce the generally tetrahedron-shaped tips 104 and 105 used to facilitate insertion of pin 100 into aperture 107 of circuit board 108.

Another method which may be utilized to fabricate pin 100 entails the extrusion of central portion 109 produced by the stamping operation to impart to it the generally cuplike-shaped cross section. In the extrusion operation the cuplike-shaped cross section is given a nonuniform thickness and pressure ridges 120 are formed directly on outer surface 113 of compliant section 101. The extrusion step in this method of fabrication replaces the swaging, coining, and cupping operations of the previously described method. As with the first method, the distant ends of terminals 102 and 103 are coined to produce the tetrahedron-shaped tips 104 and 105.

Still another method of fabricating pin 100 employs the stamping operation of the first two methods. However, in this method of fabrication, swaging is utilized to produce the nonuniform thickness of the pressure ridges 120. The swaged central portion 109 is then formed to impart the generally cuplike-shaped cross section. As before, the tetrahedron-shaped tips 104 and 105 are produced by coining the distant ends of terminals 102 and 103.

In all cases, it is to be understood that the above-described embodiments are illustrative of but a small number of many possible specific embodiments which can represent applications of the principles of the invention. Thus, numerous and various other embodiments can readily be devised in accordance with these principles by those skilled in the art without departing from the spirit and scope of the invention.

What is claimed is:

1. A connector for electrically interconnecting multiple conductive layers in a circuit board having at least one aperture therein with electrically conductive material about its periphery including first and second means for receiving electrically conductive elements, unitary compliant means, intermediate said first and second means and gradually increasing in cross-sectional thickness from a first end point to a midpoint and thereafter gradually decreasing in cross-sectional thickness from said midpoint to a second end point, for producing a nearly uniform radial pressure on said electrically conductive material on the periphery of said aperture upon the insertion of said connector into said aperture, means, integral with and abruptly increasing the cross-sectional thickness of an intermediate region along the length of said unitary compliant means at a plurality of discrete radial points, for engaging said conductive material about said aperture periphery at said plurality of discrete radial points, means, integral with said unitary compliant means, for segmenting said compliant means into a plurality of semiseparate segments, each of said segments engageable with a separate circuit board in an axially assigned stack of such boards, and said engaging means on each of said segments are radially offset from one another.

2. The connector in accordance with claim 1 wherein each of said first and second means includes an elongated member having a generally rectangular cross section, and a generally tetrahedron-shaped tip at an end point of said elongated member for facilitating insertion of said connector into said aperture.

3. The connector in accordance with claim 2 wherein said engaging means, integral with said unitary compliant means, break up any oxides formed on said electrically conductive material on said aperture periphery and displace portions of said conductive material thereby reducing the production of conductive slivers as said connector is inserted into said aperture, permit passage of flux and solder between said compliant means and said electrically conductive material on said aperture periphery, and impede rotation of said connector as a wire-wrapped connection is made with said elongated member.

4. The connector in accordance with claim 2 wherein said unitary compliant means includes a central section having a diameter slightly larger than a diameter of said aperture and substantially larger than a width dimension of a side face of said elongated member, said central section having a generally cuplike-shaped cross section lying in a plane perpendicular to a plane containing an axis of symmetry of said connector, said cuplike-shaped cross section having a nonuniform thickness between an inner surface and an outer surface, and first and second spaced apart end sections having tapered cross sections coupling said central section to said first and second means.

5. The connector in accordance with claim 4 wherein said segmenting means includes at least one pair of oppositely directed notches extending from end points of said cuplike-shaped cross section to intermediate points in said unitary compliant means, said notches oriented at a predetermined angle with respect to said axis of symmetry of said connector.

6. The connector in accordance with claim 4 wherein said cuplike-shaped cross section has a generally polygonal-shaped outer surface.

7. The connector in accordance with claim 1 wherein said engaging means comprises a ridge having first and second face oriented at an angle between 90 degrees and 150 degrees with respect to one another.

8. The connector in accordance with claim 1 wherein said engaging means comprises a projection having first, second, and third faces, said first and third faces being spaced apart and generally parallel with one another and said second face is generally perpendicular to said first and third faces.

9. The connector in accordance with claim 1 wherein said engaging means comprises a projection having a single generally semicircular face.

10. A connector for electrically interconnecting multiple conductive layers in a circuit board having at least one aperture therein with electrically conductive material about its periphery comprising first and second end portions for receiving electrically conductive elements, a compliant portion intermediate said first and second end portions, said compliant portion having a generally cuplike-shaped cross section lying in a plane perpendicular to a plane containing an axis of symmetry of said connector, said cuplike-shaped cross section having a gradually increasing cross-sectional thickness from a first end point to a midpoint and thereafter having a gradually decreasing cross-sectional thickness from said midpoint to a second end point, said compliant portion further including at least one pair of oppositely directed notches extending from end points of said cuplike-shaped cross section to intermediate points in said compliant portion, said notches oriented at a predetermined angle with respect to said axis of symmetry of said connector and separating said compliant portion into at least two semiseparate segments each of which is engageable with a separate circuit board in an axially aligned stack of such boards, and a plurality of generally parallel pressure ridges on an outer surface of an intermediate region along the length of said compliant portion, said pressure ridges abruptly increasing the cross-sectional thickness of said compliant portion at a plurality of discrete radial points, for engaging said conductive material about said aperture periphery at said plurality of discrete radial points, said pressure ridges being generally parallel with an axis of symmetry of said connector.

11. The connector in accordance with claim 10 wherein each of said first and second end portions includes an elongated member having a generally rectangular cross section, and a generally tetrahedron-shaped tip at an end point of said elongated member for facilitating insertion of said connector into said aperture.

12. The connector in accordance with claim 11 wherein said compliant portion includes a central section having a diameter slightly larger than a diameter of said aperture and substantially larger than a width dimension of a side face of said elongated member, and first and second spaced apart end sections having tapered cross sections coupling said central section to said first and second end portions.

13. The connector in accordance with claim 10 wherein said pressure ridges on each of said semiseparate segments are radially offset from one another.

14. The connector in accordance with claim 10 wherein said pressure ridges include projections having first and second faces oriented at an angle between 90° and 150° with respect to one another.

15. The connector in accordance with claim 10 wherein said pressure ridges include projections having first, second, and third faces, said first and third faces being spaced apart and generally parallel with one another and said second face is generally perpendicular to said first and third faces.

16. The connector in accordance with claim 10 wherein said pressure ridges include projections having a single generally semicircular face.

17. The connector in accordance with claim 10 wherein said cuplike-shaped cross section has a generally polygonal-shaped outer surface.

* * * * *

UNITED STATES PATENT AND TRADEMARK OFFICE
CERTIFICATE OF CORRECTION

PATENT NO. : 4,076,356
DATED : February 28, 1978
INVENTOR(S) : Peter J. Tamburro It is certified that error appears in the above–identified patent and that said Letters Patent are hereby corrected as shown below:

Column 1, line 40, "provided" should read --prohibited--.
Column 2, line 20, "produces" should read --provides--.
Column 4, line 28, between "will" and "engage" insert --each--; line 31, between "advantages" and "attributed" insert --previously--.

Signed and Sealed this

Twentieth Day of June 1978

[SEAL]

Attest:

RUTH C. MASON
Attesting Officer

DONALD W. BANNER
Commissioner of Patents and Trademarks